(12) United States Patent
Shin et al.

(10) Patent No.: US 7,704,814 B2
(45) Date of Patent: Apr. 27, 2010

(54) METHOD FOR MANUFACTURING MOS TRANSISTOR OF SEMICONDUCTOR DEVICE

(75) Inventors: Hyun Soo Shin, Choongbuk (KR); Jae Won Han, Suwon-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 49 days.

(21) Appl. No.: 11/498,680

(22) Filed: Aug. 2, 2006

(65) Prior Publication Data
US 2007/0032027 A1    Feb. 8, 2007

(30) Foreign Application Priority Data
Aug. 2, 2005    (KR)    ...................... 10-2005-0070677

(51) Int. Cl.
*H01L 21/336*    (2006.01)
(52) U.S. Cl. ........................ 438/197; 438/142; 438/199; 438/200; 438/218; 257/391; 257/392; 257/500; 257/501; 257/553; 257/E27.064
(58) Field of Classification Search ........................ None
See application file for complete search history.

(56) References Cited

U.S. PATENT DOCUMENTS

| 5,472,887 | A | * | 12/1995 | Hutter et al. | ................. | 438/231 |
| 6,077,736 | A | * | 6/2000 | Hwang et al. | ................. | 438/231 |
| 6,388,288 | B1 | * | 5/2002 | Vasanth et al. | .............. | 257/344 |
| 6,573,166 | B2 | * | 6/2003 | Chen | .......................... | 438/519 |

OTHER PUBLICATIONS

Plummer, J.D., "Silicon VLSI Technology: Fundamentals, Practice and Modeling," Prentice Hall, 2000, pp. 17, 451-456.*

* cited by examiner

*Primary Examiner*—Alexander G Ghyka
*Assistant Examiner*—Leonard Chang
(74) *Attorney, Agent, or Firm*—The Law Offices of Andrew D. Fortney; Andrew D. Fortney; William K. Nelson

(57) ABSTRACT

Disclosed is a method for manufacturing a semiconductor device including a low-voltage MOS transistor and a high-voltage MOS transistor. The present method includes a low-voltage well implantation process on a semiconductor substrate to form a first well in a first region of the substrate and a second well in a second region of the substrate; forming first and second gate oxide layers and first and second gate electrodes in the first and second regions, respectively; forming a first photoresist pattern to expose the first region; forming a first LDD region in the first region exposed by the first photoresist pattern and the first gate electrode; removing the first photoresist pattern; forming a second photoresist pattern to expose the second region; forming a second LDD region in the second region exposed by the second photoresist pattern and the second gate electrode; performing a compensational implantation on the second region to adjust a well concentration for the high-voltage MOS transistor; and removing the second photoresist pattern.

20 Claims, 22 Drawing Sheets

METHOD FOR MANUFACTURING MOS TRANSISTOR OF SEMICONDUCTOR DEVICE

This application claims the benefit of Korean Application No. 10-2005-0070677, filed on Aug. 2, 2005, which is incorporated by reference herein in its entirety.

BACKGROUND OF THE INVENTION

1. Field of the Invention

The present invention relates to a semiconductor manufacturing method. More specifically, the present invention relates to a method for manufacturing a metal oxide semiconductor (MOS) transistor in a semiconductor device.

2. Description of the Related Art

A conventional MOS transistor manufacturing method comprises: forming isolation layers in a semiconductor substrate; forming a gate oxide layer and a poly-silicon layer on the substrate; patterning the gate oxide layer and the poly-silicon layer to form a gate electrode; and implanting impurities in the substrate beside the gate electrode to form source and drain regions.

According to the trend of high-integration and low source power in semiconductor devices, the dimension and the driving voltage of the MOS transistor are decreasing more and more. Recently, semiconductor devices operated under at least two different-valued driving sources in one chip have been developed. For example, a semiconductor chip in use of a cellular phone includes a low-voltage MOS transistor operated under a relatively low driving voltage of about 1.2V, and a high-voltage MOS transistor operated under a relatively high driving voltage of about 3.3V.

FIGS. 1a to 1e are cross-sectional views illustrating a method for manufacturing MOS transistors in a semiconductor substrate, according to a conventional art. Referring to these drawings, a method for manufacturing a semiconductor device including a low-voltage MOS transistor and a high-voltage MOS transistor will be explained in detail. Here, reference symbols A and B indicate a region for a low-voltage MOS transistor, and a region for a high-voltage MOS transistor, respectively.

As shown in FIG. 1a, isolation layers 12 are formed in a semiconductor substrate 10, e.g., a silicon substrate, according to a shallow trench isolation (STI) process. Then, a photoresist pattern 14 is formed on the semiconductor substrate 10 including the isolation layers 12, using a photolithography process, to expose the low-voltage MOS transistor region A. Using a well implantation process, conductive impurities are implanted in the substrate 10 of the low-voltage MOS transistor region A to form a first well 16. For example, in the case of a N-channel MOS (NMOS) transistor, the well implantation is performed under conditions comprising boron (B) ions as a first conductivity type of impurity (i.e., P-type impurity), an implantation energy of 260 KeV, and a dose of 2E13 ions/cm2. Alternatively, in the case of a P-channel MOS (PMOS) transistor, the well implantation is performed under conditions comprising phosphorus (P) ions as a second conductivity type of impurity (i.e., N-type impurity), an implantation energy of 500 KeV, and a dose of 1E13 ions/cm2, or comprising arsenic (As) ions as a second conductivity type of impurity, an implantation energy of 100 KeV, and a dose of 3.5E12 ions/cm2. After then, the photoresist pattern 14 is removed using an ashing process.

As shown in FIG. 1b, a photoresist pattern 18 is formed, using a photolithography process, to expose the high-voltage MOS transistor region B. Using a well implantation process, conductive impurities are implanted in the substrate 10 of the high-voltage MOS transistor region B to form a second well 20. For example, in the case of a NMOS transistor, the second well implantation is preferably performed under conditions comprising boron (B) ions as a first conductivity type of impurity, an implantation energy of 260 KeV, and a dose of 2E13 ions/cm$^2$. Similarly, in the case of a PMOS transistor, the second well implantation is preferably performed under conditions comprising phosphorus (P) ions as a second conductivity type of impurity, an implantation energy of 500 KeV, and a dose of 1E13 ions/cm$^2$. After then, the photoresist pattern 18 is removed using an ashing process.

Subsequently, as shown in FIG. 1c, the semiconductor substrate 10, comprising the first well 16 and the second well 20, undergoes a thermal oxidation process, thus a gate oxide layer is formed thereon. Then, a doped poly-silicon layer is deposited on the gate oxide layer. The doped poly-silicon layer and the gate oxide layer are patterned by a dry etching process using a gate mask, thus forming gate electrodes 24 and gate oxide layer patterns 22 on the first and second wells 16 and 20, respectively.

Next, as shown in FIG. 1d, a photoresist pattern 26 is formed on the semiconductor substrate 10 to expose the low-voltage MOS transistor region A. Using an implantation process for a lightly doped drain (LDD) structure, impurities are implanted in the substrate 10 exposed by the gate electrode 24 in the low-voltage MOS transistor region A, thus forming a first LDD region 28. Here, the conductivity type of the LDD structure is opposite to the conductivity type of the well region. For example, in the first LDD implantation for a NMOS transistor, B or BF$_2$ ions as a first conductivity type of impurity are implanted under conditions comprising an implantation energy of 50 KeV and a dose of about 2.3E13 ions/cm$^2$, and continuously As ions as a second conductivity type of impurity are implanted under conditions comprising an implantation energy of 3 KeV and a dose of 9.6E14 ions/cm$^2$. In the first LDD implantation for a PMOS transistor, As ions as a second conductivity type of impurity are implanted under conditions comprising an implantation energy of 60 KeV and a dose of 2.7E13 ions/cm$^2$, and continuously B ions as a first conductivity type of impurity are implanted under conditions comprising an implantation energy of 2.5 KeV and a dose of 5.2E14 ions/cm$^2$. After then, the photoresist pattern 26 is removed using an ashing process.

Subsequently, as shown in FIG. 1e, a photoresist pattern 30 is formed on the substrate 10, using a photolithography process, to expose the high-voltage MOS transistor region B. Using a LDD implantation process, conductive impurities are implanted in the substrate 10 exposed by the gate electrode 24 of the high-voltage MOS transistor region B to form a second LDD region 32. For example, in the second LDD implantation for a NMOS transistor, As ions as a second conductivity type of impurity are implanted under conditions comprising an implantation energy of 50 KeV and a dose of about 1E13 ions/cm$^2$, and continuously P ions as a second conductivity type of impurity are implanted under conditions comprising an implantation energy of 40 KeV and a dose of 2E13 ions/cm$^2$. Similarly, in the second LDD implantation for a PMOS transistor, B or BF$_2$ ions as a first conductivity type of impurity are implanted under conditions comprising an implantation energy of 5 KeV and a dose of 1.5E14 ions/cm$^2$. After then, the photoresist pattern 30 is removed using an ashing process.

Next, a silicon nitride layer (not shown), as an insulating layer, is thinly formed on the entire surface of the resultant structure, and then it is etched back to form spacers at the sides of the gate electrodes 24. In addition, an implantation process is performed on the low-voltage MOS transistor region A and the high-voltage MOS transistor region B, respectively, thus forming source/drain regions for a low-voltage MOS transistor and a high-voltage MOS transistor.

However, the above-described conventional method needs a number of masks for photoresist patterns in use of forming wells, LDD regions, and source/drain regions, which results in loss of productivity and increase of production costs.

SUMMARY OF THE INVENTION

It is, therefore, an object of the present invention to provide a method for manufacturing a semiconductor device including a low-voltage MOS transistor and a high-voltage MOS transistor, wherein a well for a low-voltage MOS transistor and a well for a high-voltage MOS transistor are formed in one photo masking process, and a compensational implantation for adjusting a well concentration of the high-voltage MOS transistor is performed after or before a LDD implantation for the high-voltage MOS transistor, thus enabling a reduction in the number of photo masks for forming photoresist patterns.

To achieve the above object, an embodiment of a method for manufacturing a semiconductor device including a low-voltage MOS transistor and a high-voltage MOS transistor according to the present invention, comprises the steps of: performing a low-voltage well implantation process on a semiconductor substrate to form a first well in a first region of the substrate and a second well in a second region of the substrate; forming first and second gate oxide layers and first and second gate electrodes in the first and second regions, respectively (and in one embodiment, simultaneously); forming a first photoresist pattern to expose the first region (and preferably cover or block implantation in the second region); forming a first LDD region in the first region exposed by the first photoresist pattern and the first gate electrode (e.g., using the first photoresist pattern and the first gate electrode as masks); removing the first photoresist pattern; forming a second photoresist pattern to expose the second region (and preferably cover or block implantation in the first region); forming a second LDD region in the second region exposed by the second photoresist pattern and the second gate electrode (e.g., using the second photoresist pattern and the second gate electrode as masks); performing a compensational implantation on the second region to adjust a well concentration for the high-voltage MOS transistor; and removing the second photoresist pattern.

In addition, a method for manufacturing a semiconductor device including a low-voltage MOS transistor and a high-voltage MOS transistor according to the present invention, comprises the steps of: performing a low-voltage well implantation process on a semiconductor substrate to form a first well in a first region of the substrate and a second well in a second region of the substrate; forming first and second gate oxide layers and first and second gate electrodes in the first and second regions, respectively (and in one embodiment, simultaneously); forming a first photoresist pattern to expose the first region (and preferably cover or block implantation in the second region); forming a first LDD region in the first region exposed by the first photoresist pattern and the first gate electrode (e.g., using the first photoresist pattern and the first gate electrode as masks); removing the first photoresist pattern; forming a second photoresist pattern to expose the second region (and preferably cover or block implantation in the first region); performing a compensational implantation on the second region to adjust a well concentration for the high-voltage MOS transistor; forming a second LDD region in the second region exposed by the second photoresist pattern and the second gate electrode (e.g., using the second photoresist pattern and the second gate electrode as masks); and removing the second photoresist pattern.

These and other aspects of the invention will become evident by reference to the following description of the invention, often referring to the accompanying drawings.

DETAILED DESCRIPTION OF THE INVENTION

FIGS. 2a to 2e are cross-sectional views illustrating a method for manufacturing MOS transistors in a semiconductor substrate, according to the present invention. Referring to these drawings, a present method for manufacturing a semiconductor device comprising a low-voltage MOS transistor and a high-voltage MOS transistor will be explained in detail. Here, reference symbols A and B indicate a region for a low-voltage MOS transistor, and a region for a high-voltage MOS transistor, respectively.

Figure 1A:
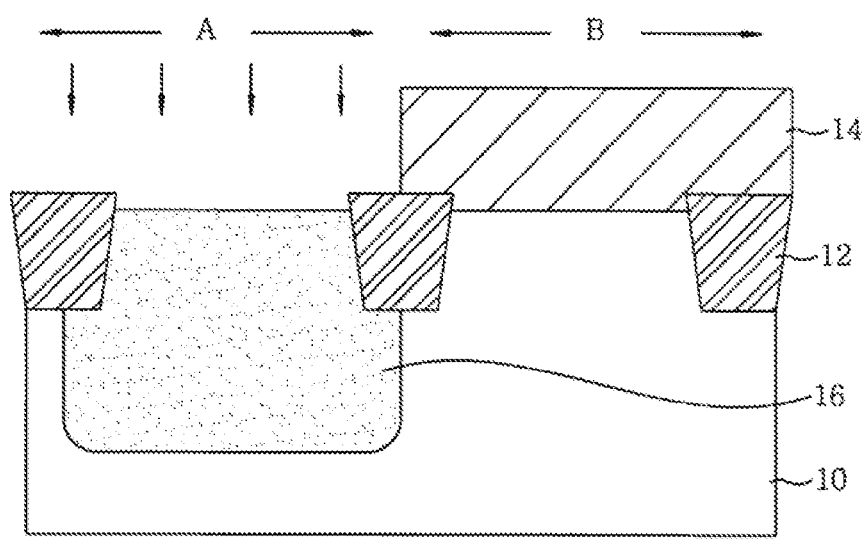
FIGS. 1a to 1e are cross-sectional views illustrating a method for manufacturing MOS transistors in a semiconductor substrate, according to a conventional art.
Figure 1B:
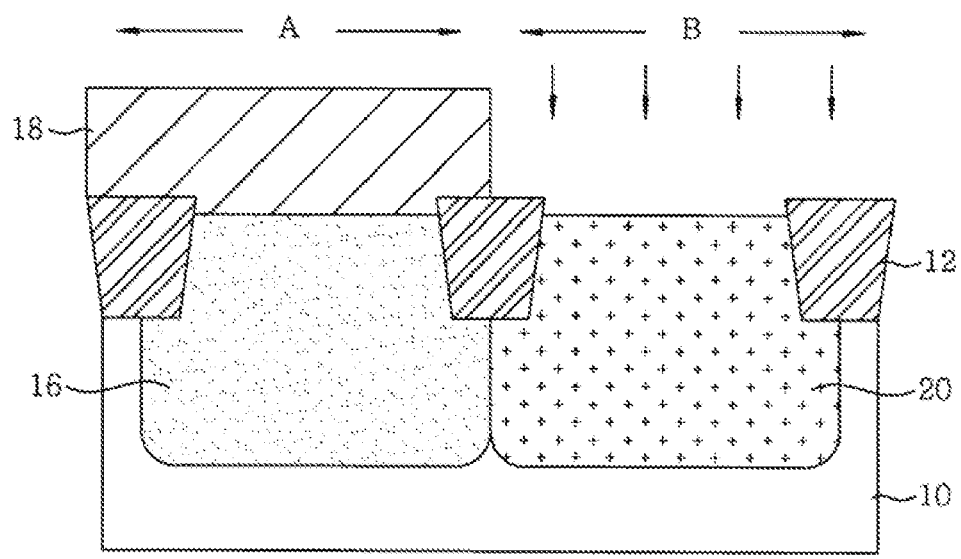
Figure 1C:
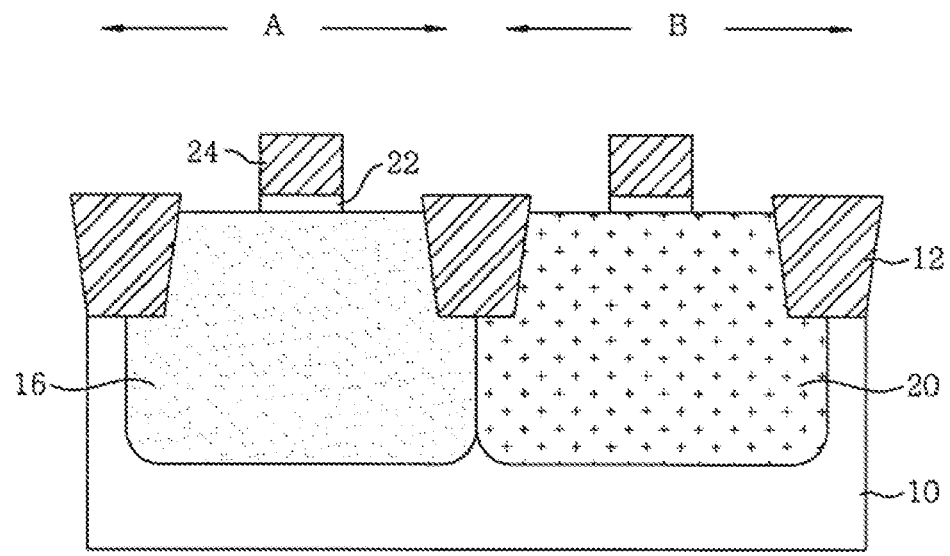
Figure 1D:
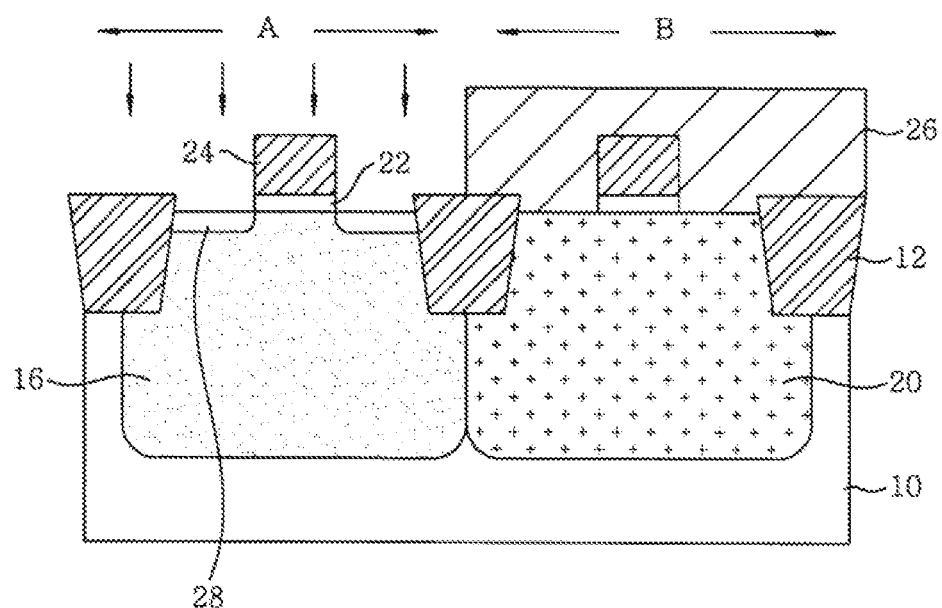
Figure 1E:
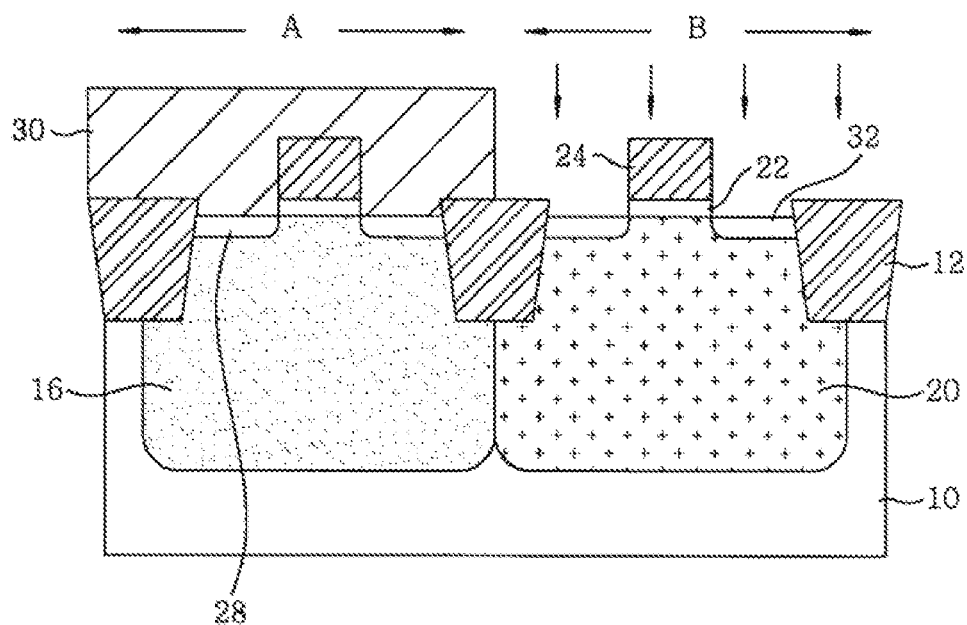
Figure 2A:
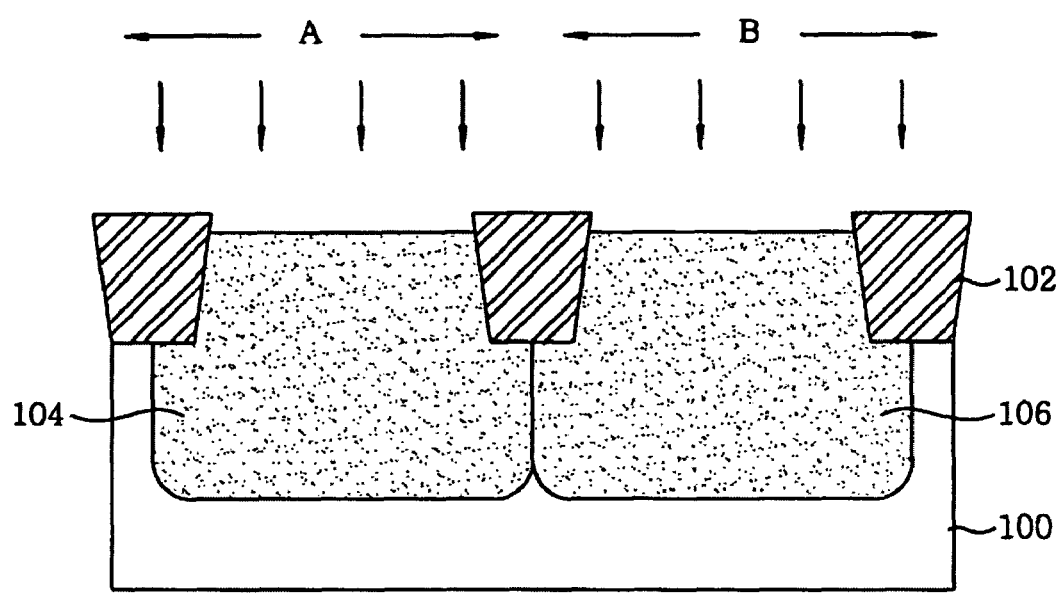
FIGS. 2a to 2e are cross-sectional views illustrating a method for manufacturing MOS transistors in a semiconductor substrate, according to the present invention.

Firstly, as shown in FIG. 2a, isolation layers 102 are formed in a semiconductor substrate 100, e.g., a silicon substrate, using a STI formation process. A well implantation process is performed, preferably on an entire surface of the semiconductor substrate 100 including the isolation layers 102, to form a first well 104 in the low-voltage MOS transistor region A and a second well 106 in the high-voltage MOS transistor region B.

Here, the well implantation process preferably utilizes implantation conditions similar to the conventional implantation conditions used in forming a well for a low-voltage MOS transistor. For example, in the case of a NMOS transistor, the well implantation is preferably performed under conditions comprising boron (B) ions as a first conductivity type of impurity, an implantation energy of 260 KeV, and a dose of $2E13$ ions/cm$^2$, although other conditions are also suitable. Alternatively, in the case of a PMOS transistor, the well implantation is preferably performed under conditions comprising phosphorus (P) ions as a second conductivity type of impurity, an implantation energy of 500 KeV, and a dose of $1E13$ ions/cm$^2$, or comprising arsenic (As) ions as a second conductivity type of impurity, an implantation energy of 100

KeV, and a dose of 3.5E12 ions/cm$^2$, although other conditions for either dopant are also suitable.

Figure 2B:
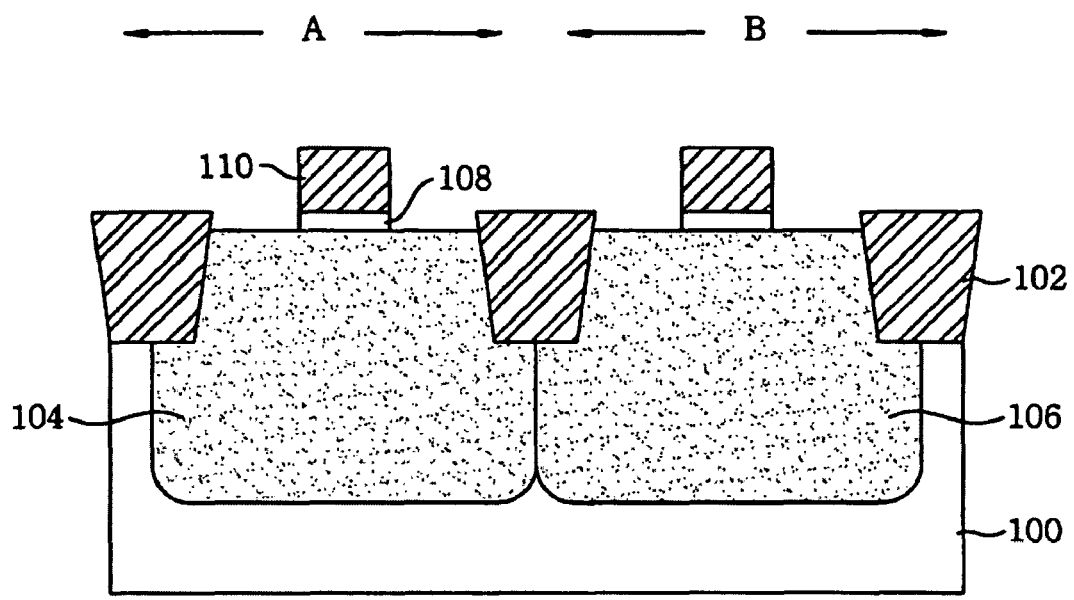

Subsequently, as shown in FIG. 2b, the semiconductor substrate 100, comprising the first well 104 and the second well 106, undergoes a thermal oxidation process, thus a gate oxide layer is formed thereon. Then, a doped polysilicon layer is formed on the gate oxide layer. The doped polysilicon layer and the gate oxide layer are patterned by a dry etching process using a gate mask, thus forming gate electrodes 110 and gate oxide pattern 108 on the first and second wells 104 and 106, respectively.

Figure 2C:
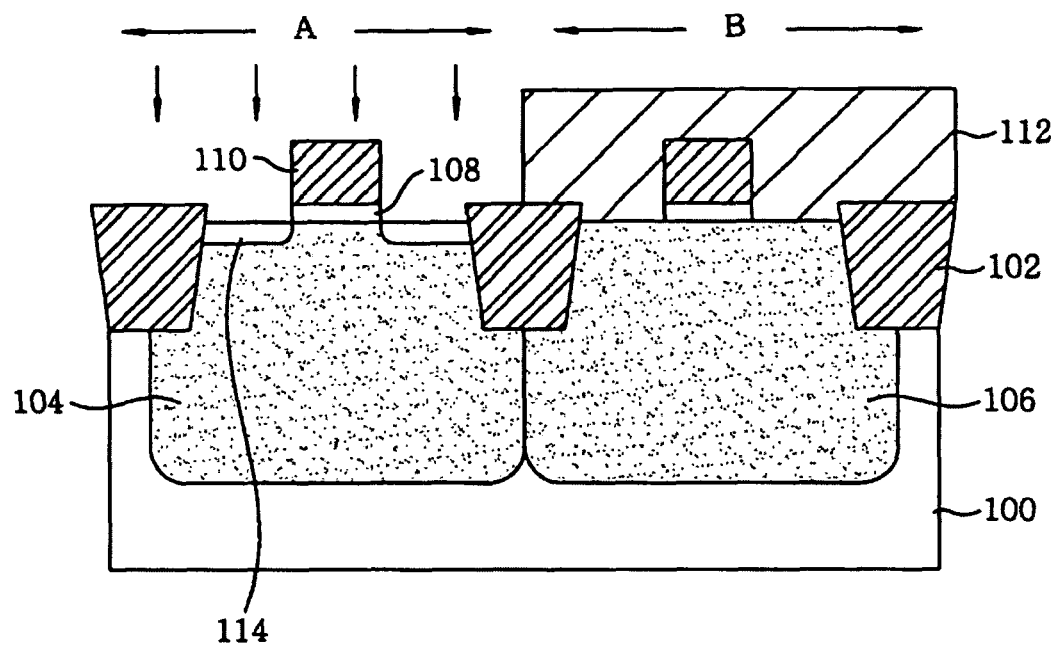

Next, as shown in FIG. 2c, a photoresist pattern 112 is formed on the semiconductor substrate 100, using a photolithography process, thus exposing the low-voltage MOS transistor region A. Using an LDD implantation process, impurities are implanted in the substrate 100 exposed by the gate electrode 110 in the low-voltage MOS transistor region A, thus forming a first LDD region 114. For example, in the first LDD implantation for a NMOS transistor, B or BF$_2$ ions as a first conductivity type of impurity are implanted under conditions comprising an implantation energy of 50 KeV and a dose of about 2.3E13 ions/cm$^2$, and then As ions as a second conductivity type of impurity are implanted under conditions comprising an implantation energy of 3 KeV and a dose of 9.6E14 ions/cm$^2$, although other conditions for either dopant are also suitable. In the first LDD implantation for a PMOS transistor, As ions as a second conductivity type of impurity are implanted under conditions comprising an implantation energy of 60 KeV and a dose of 2.7E13 ions/cm$^2$, and continuously B or BF$_2$ ions as a first conductivity type of impurity are implanted under conditions comprising an implantation energy of 2.5 KeV and a dose of 5.2E14 ions/cm$^2$, although other conditions for either dopant are also suitable. After that, the photoresist pattern 112 is removed using an ashing process.

Figure 2D:
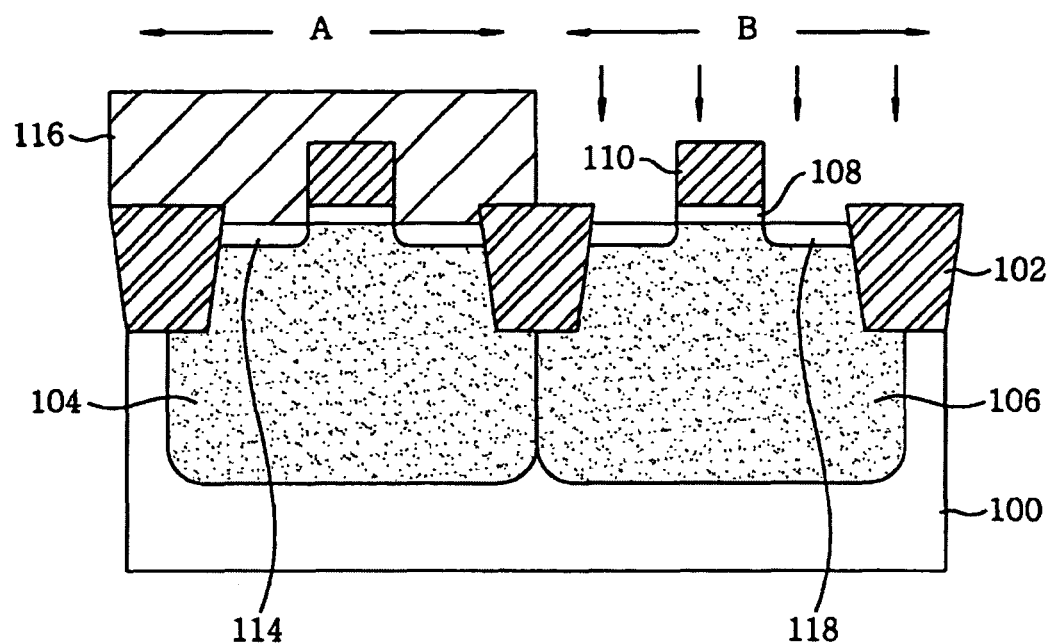

Subsequently, as shown in FIG. 2d, a photoresist pattern 116 is formed on the substrate 100, using a photolithography process, thus exposing the high-voltage MOS transistor region B. Using a LDD implantation process, conductive impurities are implanted in the substrate 100 exposed by the gate electrode 110 of the high-voltage MOS transistor region B to form a second LDD region 118. For example, in the second LDD implantation for a NMOS transistor, P ions as a second conductivity type of impurity are implanted under conditions comprising an implantation energy of 170 KeV and a dose of about 4E13 ions/cm$^2$, and then As ions as a second conductivity type of impurity are implanted under conditions comprising an implantation energy of 50 KeV and a dose of about 1E13 ions/cm$^2$, and further P ions as a second conductivity type of impurity are implanted under conditions comprising an implantation energy of 40 KeV, and a dose of 2E13 ions/cm$^2$, although other conditions for any of these implants are also suitable. Similarly, in the second LDD implantation for a PMOS transistor, P ions as a second conductivity of impurity are implanted under conditions comprising an implantation energy of 170 KeV and a dose of about 2.5E13 ions/cm$^2$, and continuously B or BF$_2$ ions as a first conductivity type of impurity are implanted under conditions comprising an implantation energy of 5 KeV and a dose of 1.5E14 ions/cm$^2$, although other conditions for any of these implants are also suitable.

Figure 2E:
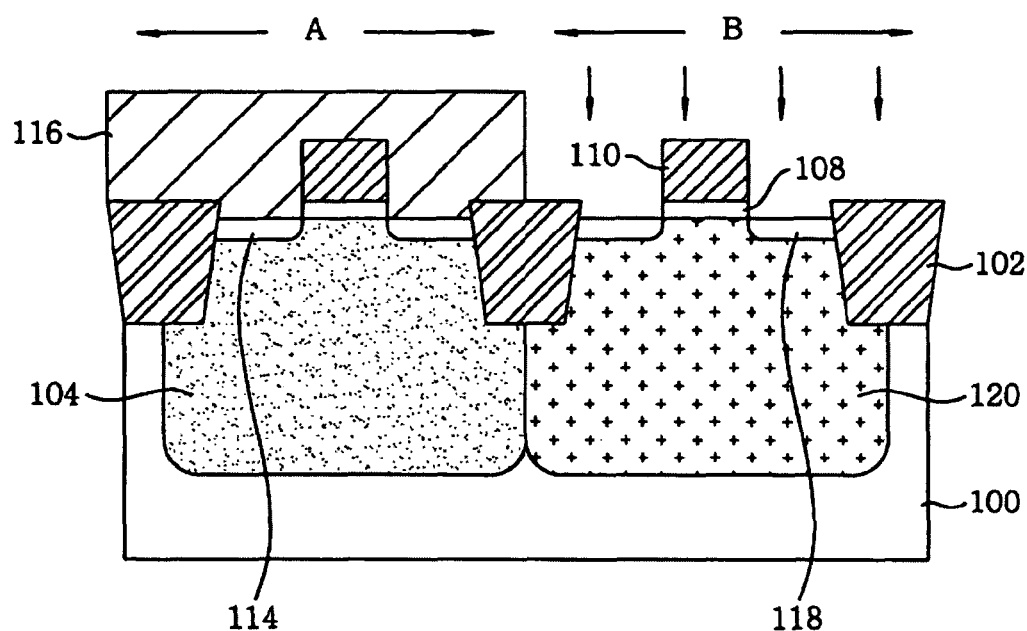

After then, as shown in FIG. 2e, a compensational implantation process is performed on the substrate 100 of the high-voltage MOS transistor region B, thus adjusting a concentration of the second well 120.

For example, the compensational implantation process for adjusting the second well 120 is performed under conditions comprising P ions as a second conductivity of impurity, an implantation energy of 170 KeV, and a dose of 4.3E12 ions/cm$^2$ in the case of a NMOS high-voltage transistor, or comprising P ions as a second conductivity of impurity, an implantation energy of 170 KeV, and a dose of 2.5E12 ions/cm$^2$ in the case of a PMOS high-voltage transistor, although other conditions for either implant are also suitable.

After that, the photoresist pattern 116 is removed using an ashing process.

Next, a silicon nitride layer (not shown), and/or another insulating layer, is thinly formed on an entire surface of the resultant structure, and then it is etched back to form spacers at the sides of the gate electrodes 110. In addition, an implantation process is performed on the low-voltage MOS transistor region A and the high-voltage MOS transistor region B, respectively, thus forming source/drain regions for a low-voltage MOS transistor and a high-voltage MOS transistor.

On the other hand, in the above-described embodiment, the compensational implantation for adjusting a concentration of the second well 120 of the high-voltage MOS transistor is performed after the LDD implantation process. Alternatively, it is possible that the compensational implantation process is performed after forming the photoresist pattern 116 exposing the high-voltage MOS transistor region B, and before the LDD implantation process.

Especially, the compensational implantation for adjusting a concentration of the second well 120 of the high-voltage MOS transistor utilizes N-type impurities such as phosphorus (P) as supplementary well impurities for a NMOS high-voltage transistor (as well as for a PMOS high-voltage transistor), in order to adjust electrical characteristics of the NMOS high-voltage transistor.

Figure 3A:
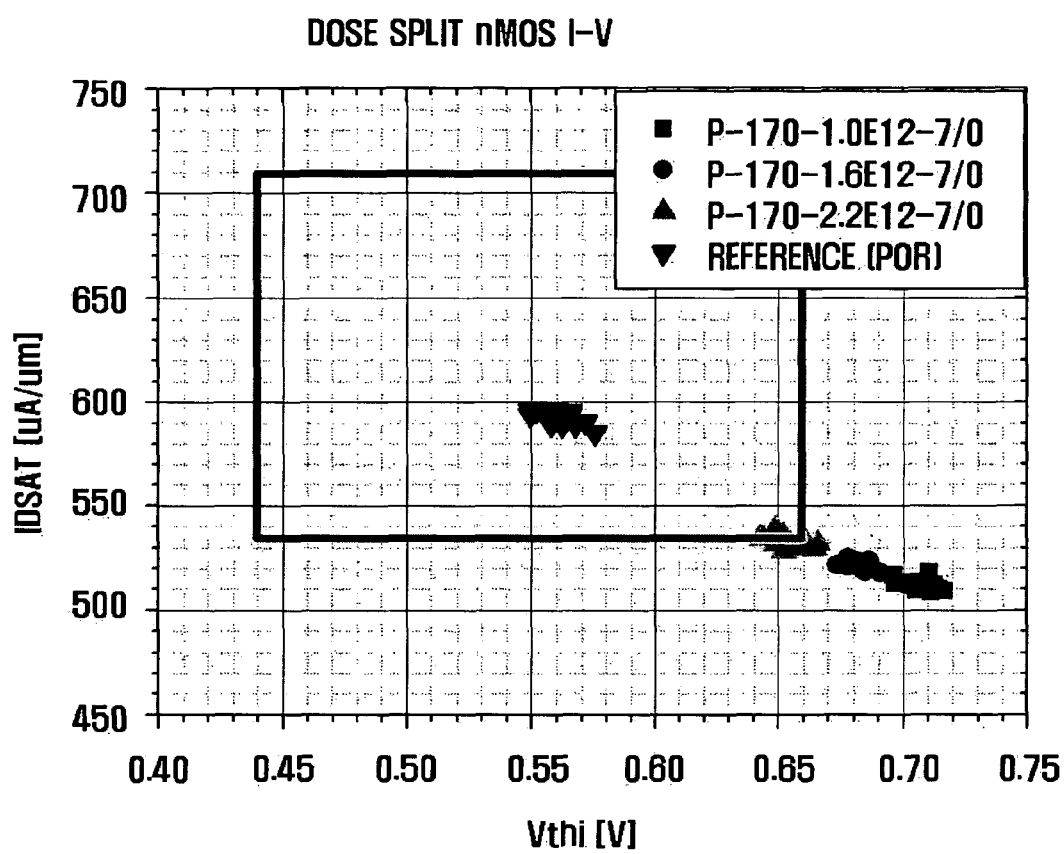
FIGS. 3a and 3b are graphs representing a well dose concentration before and after a LDD implantation for obtaining a NMOS threshold voltage, in a conventional art and the present invention.
Figure 3B:
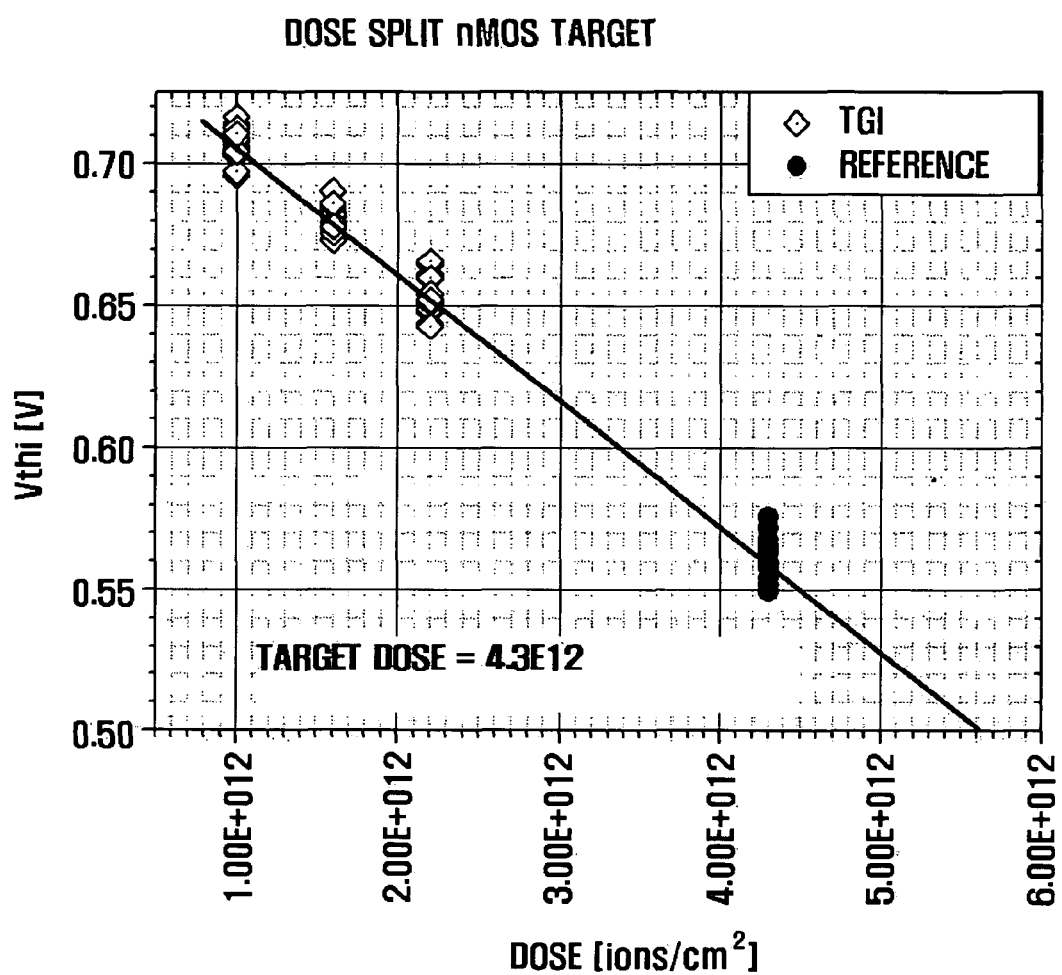

FIGS. 3a and 3b are graphs representing a well dose concentration before or after a LDD implantation for obtaining a NMOS threshold voltage, in a conventional art and the present invention.

In drain saturation current (Idsat) vs. threshold voltage (Vthi) graph of a NMOS high-voltage transistor as shown in FIG. 3a, the compensational implantation for the NMOS well concentration according to the present invention utilizes a well dose of 4.3E12 ions/cm$^2$ (shown in FIG. 3b) to obtain a NMOS threshold voltage of about 0.55V as the conventional case (∇, Reference). Here, the mark TGI indicates the case where the compensational implantation according to the present invention is applied, and reference or POR indicates a conventional case.

Figure 4A:
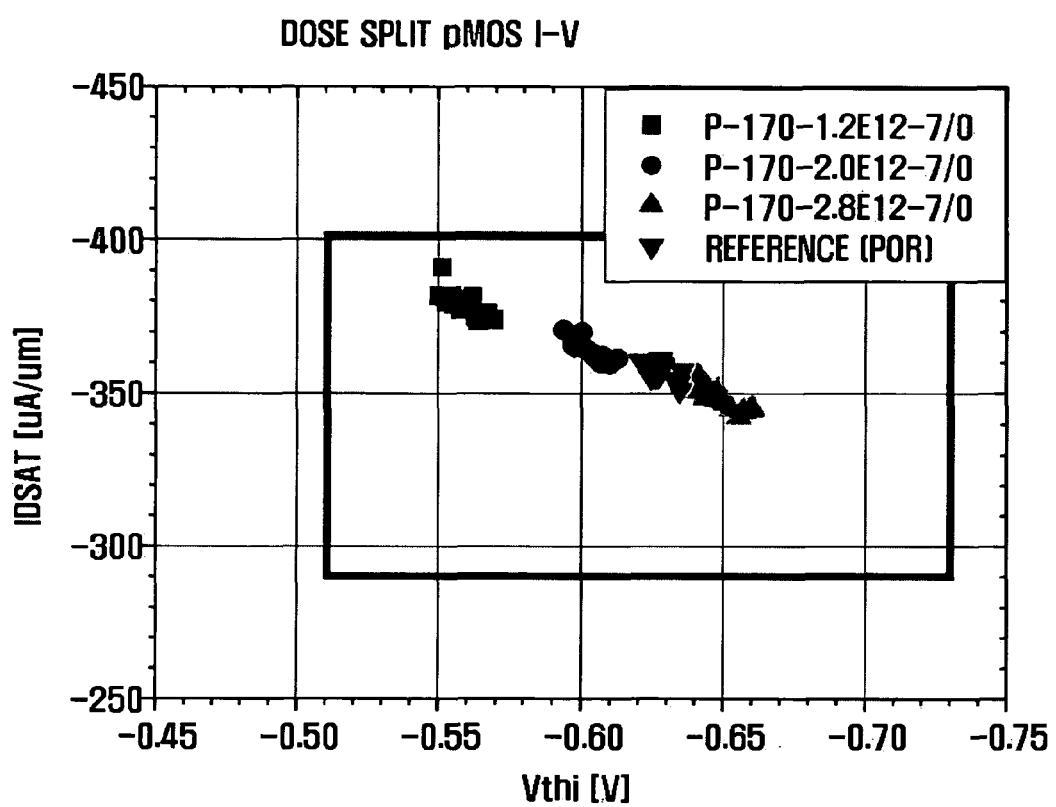
FIGS. 4a and 4b are graphs representing a well dose concentration before and after a LDD implantation for obtaining a PMOS threshold voltage, in a conventional art and the present invention.
Figure 4B:
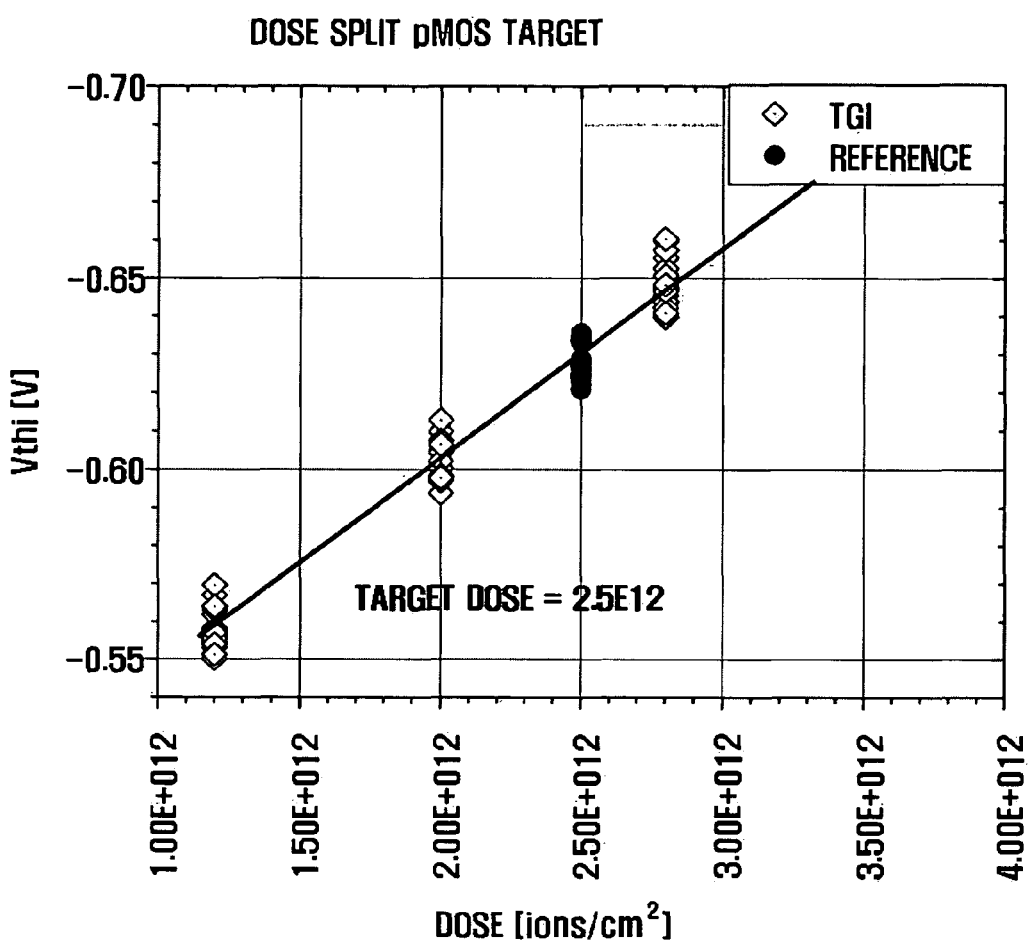

FIGS. 4a and 4b are graphs representing a well dose concentration before and after a LDD implantation for obtaining a PMOS threshold voltage, in a conventional art and the present invention.

In drain saturation current (Idsat) vs. threshold voltage (Vthi) graph of a PMOS high-voltage transistor as shown in FIG. 4a, the compensational implantation for the PMOS well concentration according to the present invention utilizes a well dose of 2.5E12 ions/cm$^2$ (shown in FIG. 4b) to obtain a PMOS threshold voltage of about 0.63V as the conventional case (∇, Reference).

Figure 5A:
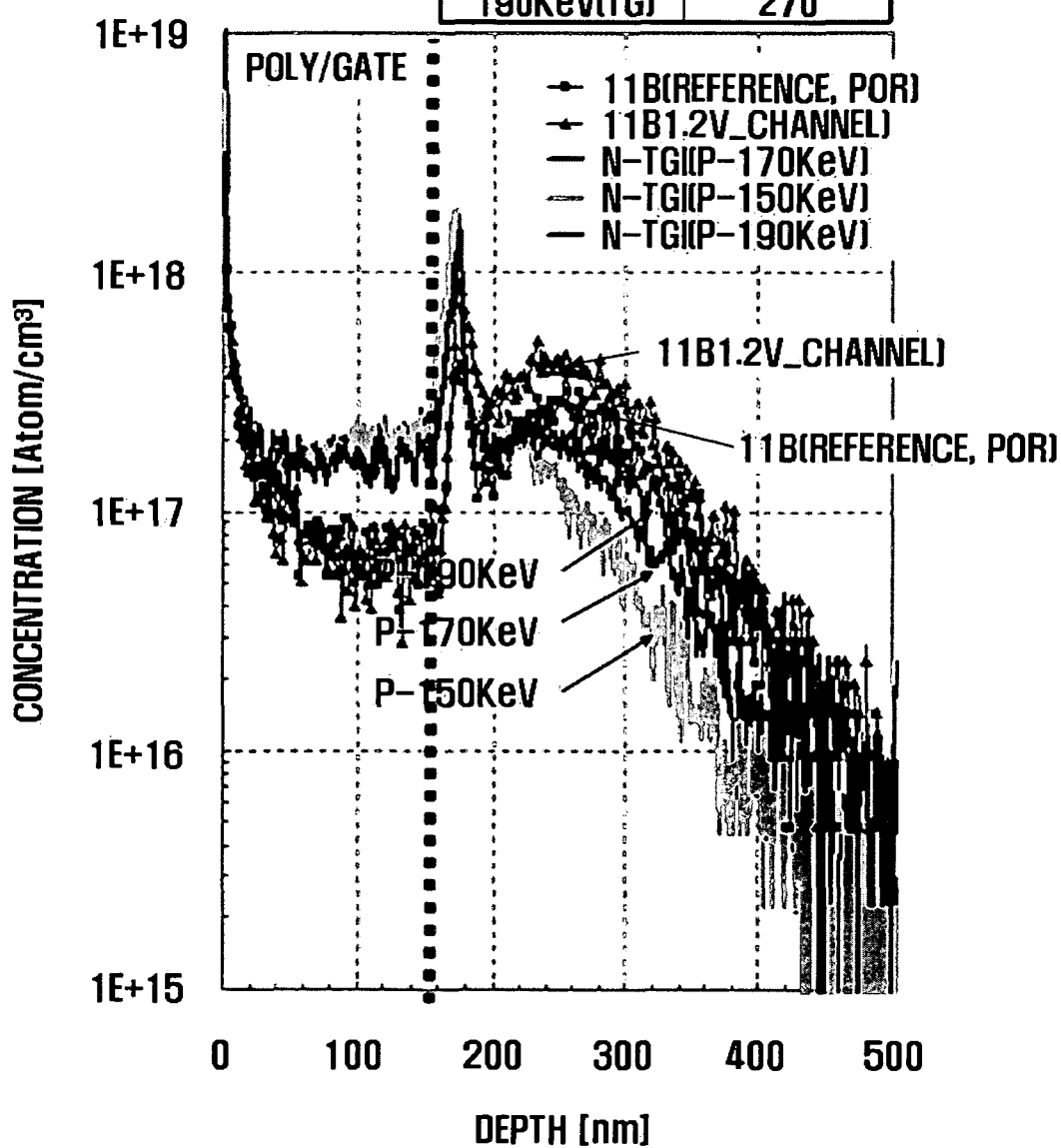
FIGS. 5a and 5b are graphs representing projection ranges of implanted ions in NMOS and PMOS, in the present invention and a conventional case.
Figure 5B:
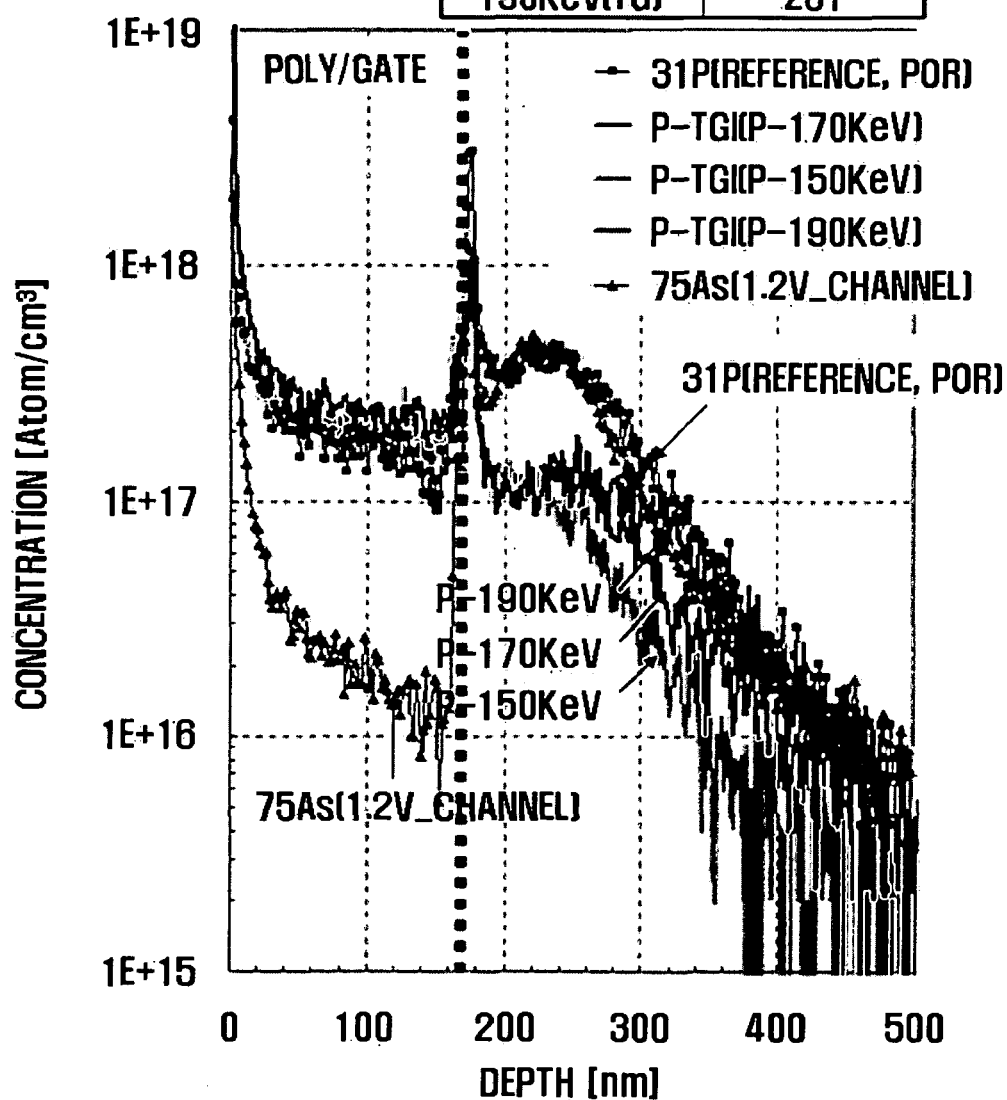

FIGS. 5a and 5b are graphs representing projection ranges of implanted ions in NMOS and PMOS, in the present invention and a conventional case.

Referring to FIGS. 5a and 5b, the projection depth (Rp) of a conventional case is 256 nm in NMOS, and 240 nm in PMOS. In the present invention, when an implantation energy is 170 KeV in the compensational implantation for adjusting a well concentration of NMOS or PMOS, it is possible to obtain an ion projection depth of 252 nm or 243 nm, similarly to the conventional case.

Figure 6A:
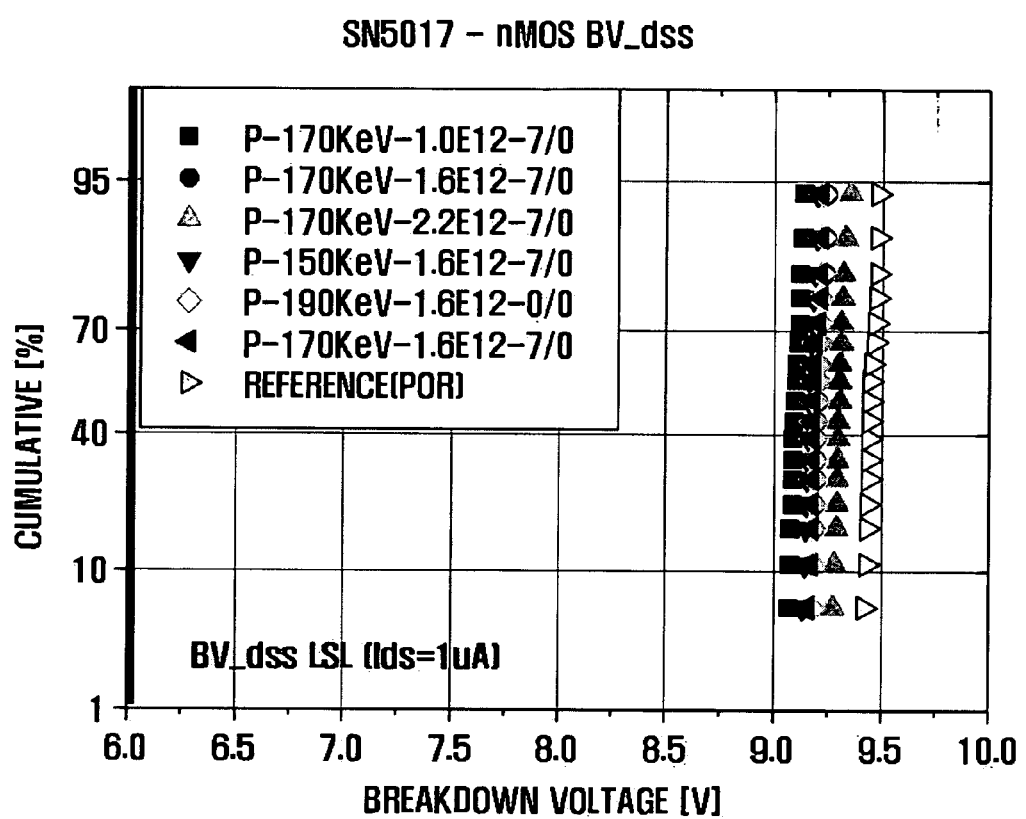
FIGS. 6a and 6b are graphs representing breakdown voltage characteristics of NMOS/PMOS, in a conventional case and the present invention.
Figure 6B:
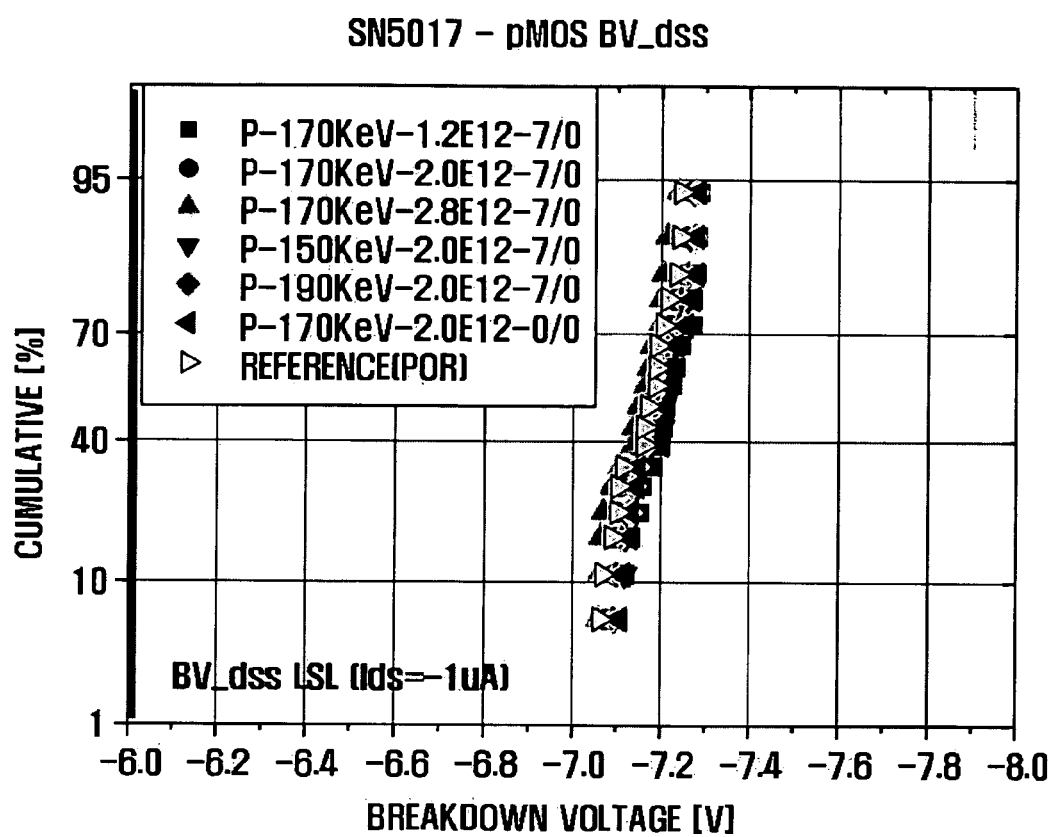

FIGS. 6a and 6b are graphs representing breakdown voltage characteristics of NMOS and PMOS, in a conventional case and the present invention.

In cumulative percentage vs. breakdown voltage graphs of NMOS and PMOS as shown in FIGS. 6a and 6b, breakdown voltages of NMOS and PMOS in the present invention (referred to as ■, ● etc.) are similar to breakdown voltages of NMOS and PMOS in the conventional case (▷, Reference).

FIGS. 7a to 7d are junction leakage characteristics of NMOS and PMOS, in the present invention and a conventional case.

Figure 7A:
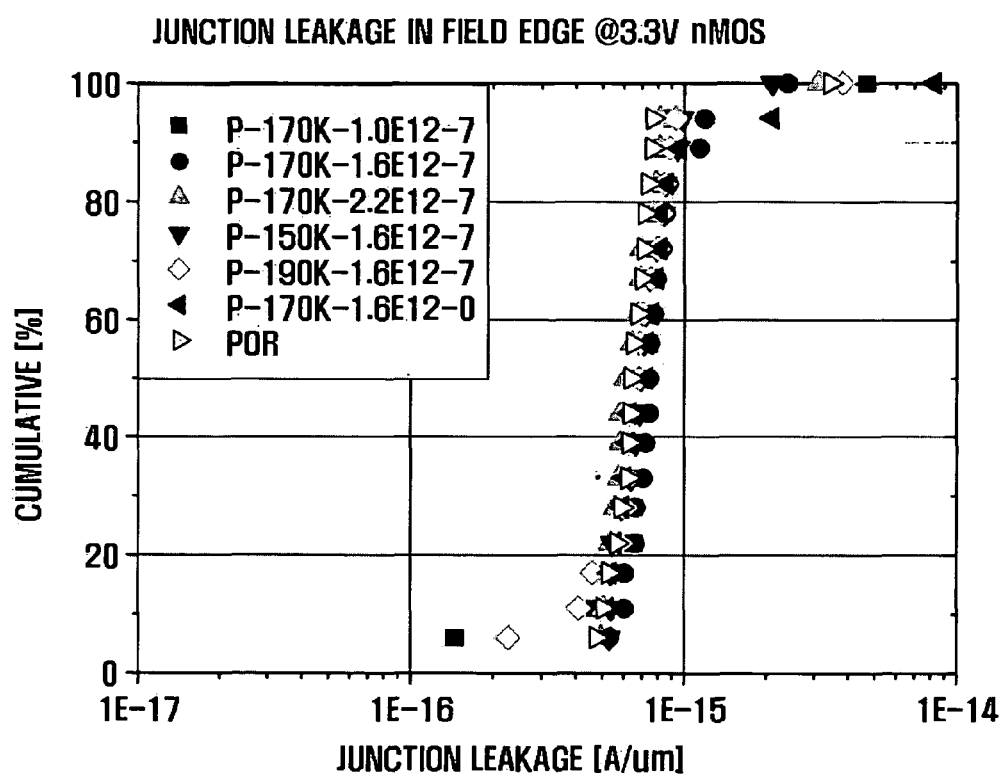
FIGS. 7a to 7d are junction leakage characteristics of NMOS and PMOS, in the present invention and a conventional case.

FIG. 7a shows a graph representing junction leakage characteristics in edges of the isolation layer (i.e., field edges) of 3.3V NMOS high-voltage transistor. It can be known that junction leakage characteristics of the present invention (referred to as ■, ● etc.) are similar to those of the conventional case (▷, Reference).

Figure 7B:
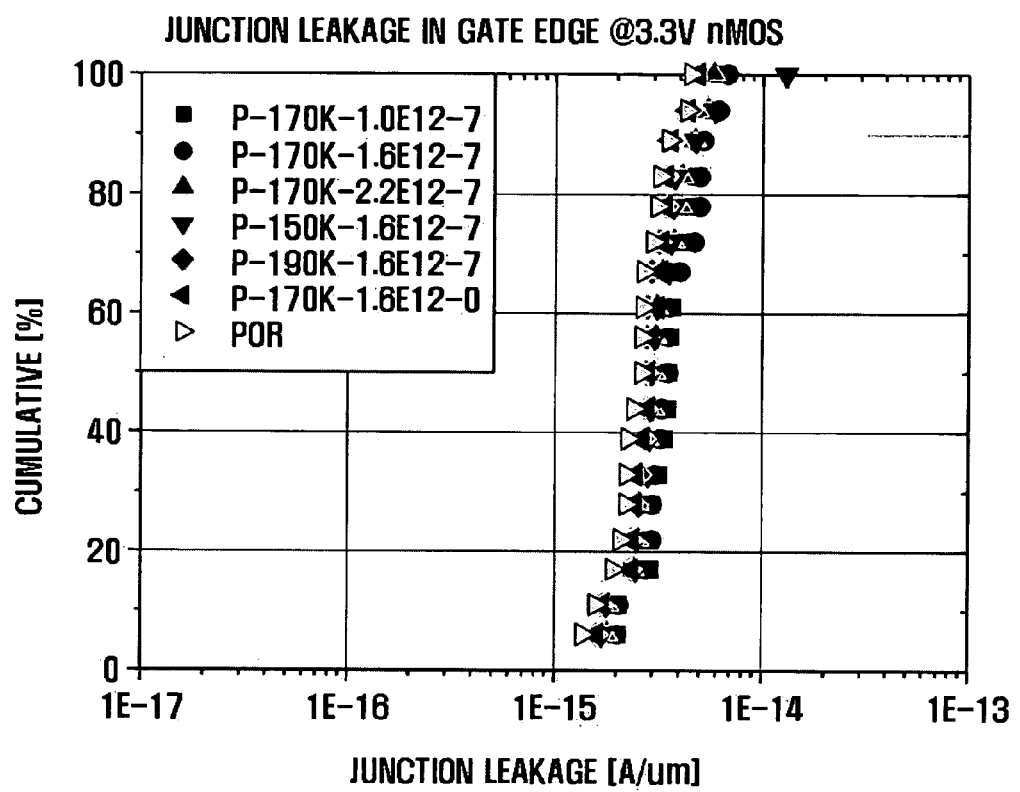

FIG. 7b shows a graph representing junction leakage characteristics in edges of the gate electrode (i.e., gate edges) of 3.3V NMOS high-voltage transistor. It can be known that junction leakage characteristics of the present invention (referred to as ■, ● etc.) are similar to those of the conventional case (▷, Reference).

Figure 7C:
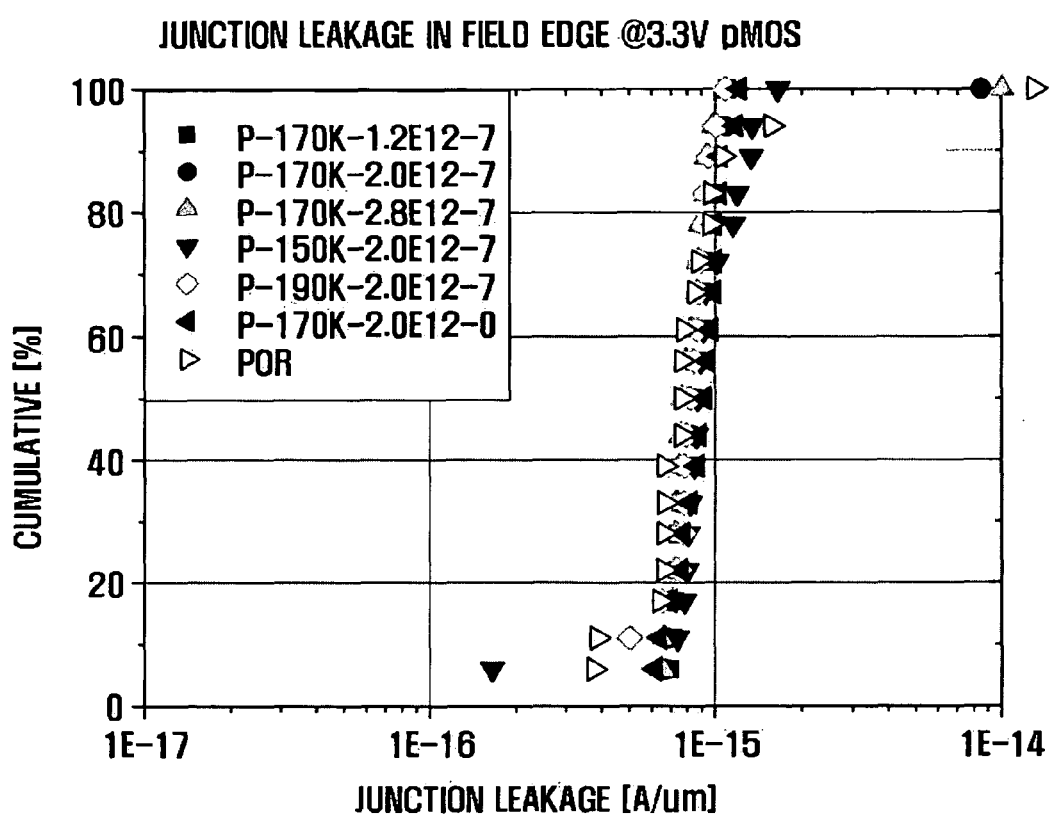
Figure 7D:
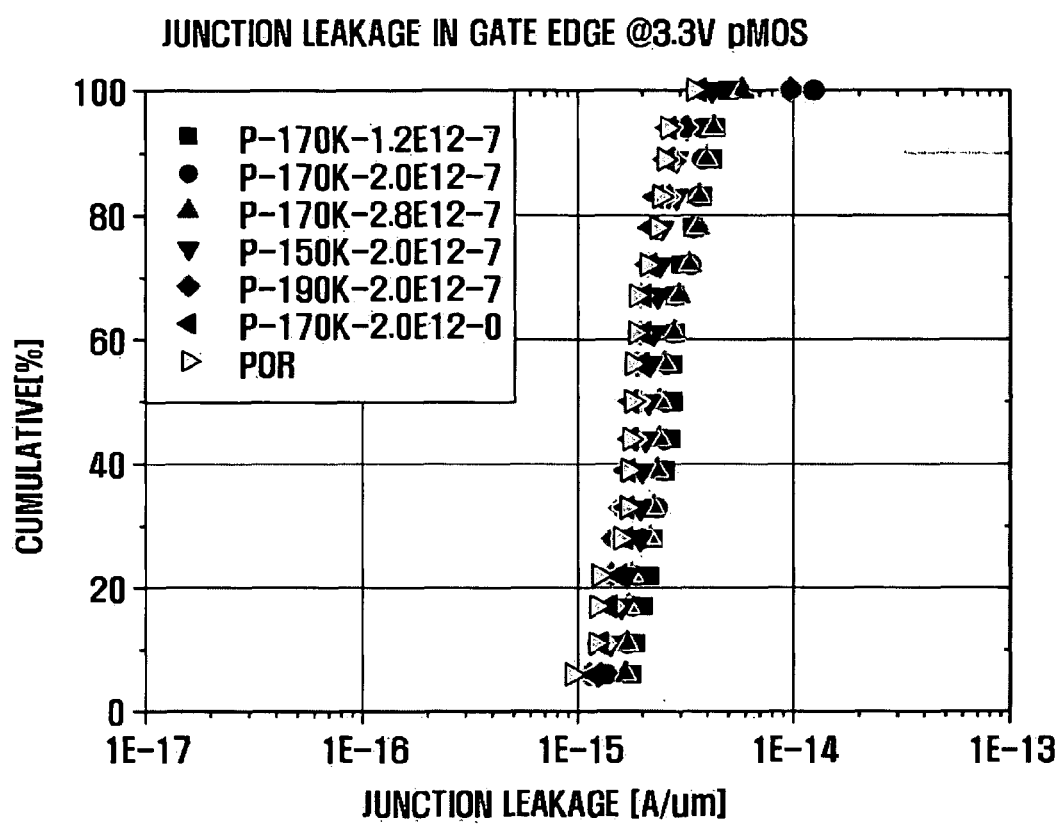

FIGS. 7c and 7d show graphs representing junction leakage characteristics in edges of the isolation layer and the gate electrode (i.e., field edges and gate edges) of 3.3V PMOS high-voltage transistor. It can be known that junction leakage characteristics of the present invention (referred to as ■, ● etc.) are similar to those of the conventional case (▷, Reference).

According to the present invention, a well for a low-voltage MOS transistor and a well for a high-voltage MOS transistor are formed in one photo masking process, and a compensational implantation for adjusting a well concentration of the high-voltage MOS transistor is performed after or before a LDD implantation for the high-voltage MOS transistor. Therefore, the number of photo masks for forming photoresist patterns can be reduced, and nonetheless, the electrical characteristics of the high-voltage MOS transistor can be maintained similarly to a conventional high-voltage MOS transistor. As a result, the present invention has advantages in that the productivity is improved and production costs are reduced.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A method for manufacturing a semiconductor device including a low-voltage MOS transistor and a high-voltage MOS transistor, comprising the steps of:

simultaneously forming a first well in a low-voltage MOS transistor region of a semiconductor substrate and a second well in a high-voltage MOS transistor region of the substrate by implanting first ions at a high implantation energy into an entire surface of the substrate;

forming a first gate oxide layer and a first gate electrode in the low-voltage MOS transistor region and forming a second gate oxide layer and a second gate electrode in the high-voltage MOS transistor region;

forming a first photoresist pattern to expose the low-voltage MOS transistor region;

forming a first LDD region in the low-voltage MOS transistor region by implanting second ions at a low implantation energy using the first photoresist pattern and the first gate electrode as masks;

removing the first photoresist pattern;

forming a second photoresist pattern to expose the high-voltage MOS transistor region;

forming a second LDD region in the high-voltage MOS transistor region by implanting third ions at a low implantation energy using the second photoresist pattern and the second gate electrode as masks;

forming a high voltage well for the high voltage MOS transistor by implanting fourth ions at a high implantation energy into the second well in the high-voltage MOS transistor region using the second photoresist and the second gate electrode as masks after forming the second LDD region; and removing the second photoresist pattern.

2. The method of claim 1, wherein the high-voltage MOS transistor region contains a NMOS high-voltage transistor, and the implanting fourth ions at a high implantation energy comprises implanting impurity ions having a conductivity type opposite to the second well.

3. The method of claim 2, wherein the fourth ions are implanted at an implantation energy in a range of 100-250 KeV, and a dose in a range of 1E12-1E13 ions/cm$^2$.

4. The method of claim 1, wherein the high-voltage MOS transistor region contains a NMOS high-voltage transistor, and the fourth ions comprise impurity ions having a conductivity type opposite to the second well, and the fourth ions are implanted at an implantation energy of 170 KeV at a dose of 4.3E12 ions/cm$^2$.

5. The method of claim 1, wherein the high-voltage MOS transistor region contains a PMOS high-voltage transistor, and the fourth ions comprise impurity ions having a conductivity type identical to the conductivity type of the second well.

6. The method of claim 5, wherein the fourth ions are implanted at an implantation energy in a range of 100-250 KeV, and a dose in a range of 1E12-5E12 ions/cm$^2$.

7. The method of claim 1, wherein the high-voltage MOS transistor region contains a PMOS high-voltage transistor, and the fourth ions comprise impurity ions having a conductivity type identical to the second well, and the fourth ions are implanted at an implantation energy of 170 KeV at a dose of 2.5E12 ions/cm$^2$.

8. The method of claim 1, wherein the first and second gate oxide layers are formed simultaneously, and the first and second gate electrodes are formed simultaneously.

9. The method of claim 1, wherein the first photoresist pattern blocks implantation of the second ions into the high-voltage MOS transistor region, and the second photoresist pattern blocks implantation of the third and fourth ions into the low-voltage MOS transistor region.

10. A method for manufacturing a semiconductor device including a low-voltage MOS transistor and a high-voltage MOS transistor, comprising the steps of:

simultaneously forming a first well in a low-voltage MOS transistor region of a semiconductor substrate and a second well in a high-voltage MOS transistor region of the substrate by implanting first ions at a high implantation energy into an entire surface of the substrate;

forming a first gate oxide layer and a first gate electrode in the low-voltage MOS transistor region and forming a second gate oxide layer and a second gate electrode in the high-voltage MOS transistor region;

forming a first photoresist pattern to expose the low-voltage MOS transistor region;

forming a first LDD region in the low-voltage MOS transistor region by implanting second ions at a low implantation energy using the first photoresist pattern and the first gate electrode as masks;

removing the first photoresist pattern;

forming a second photoresist pattern to expose the high-voltage MOS transistor region;

forming a high voltage well for the high voltage MOS transistor by implanting third ions at a high implantation energy into the second well in the high-voltage MOS transistor region using the second photoresist and the second gate electrode as masks;

forming a second LDD region in the high-voltage MOS transistor region by implanting fourth ions at a low implantation energy using the second photoresist pattern and the second gate electrode as masks after adjusting a well ion concentration of the second well; and removing the second photoresist pattern.

11. The method of claim 10, wherein the high-voltage MOS transistor region contains a NMOS high-voltage transistor, and the implanting third ions at a high implantation energy comprises implanting impurity ions having a conductivity type opposite to the second well.

12. The method of claim 11, wherein the third ions are implanted at an implantation energy in a range of 100-250 KeV, and a dose in a range of 1E12-1E13 ions/cm$^2$.

13. The method of claim 10, wherein the high-voltage MOS transistor region contains a NMOS high-voltage transistor, and the third ions comprise impurity ions having a conductivity type opposite to the second well, and the third ions are implanted at an implantation energy of 170 KeV at a dose of 4.3E12 ions/cm$^2$.

14. The method of claim 10, wherein the high-voltage MOS transistor region contains a PMOS high-voltage transistor, and the third ions comprise impurity ions having a conductivity type identical to the conductivity type of the second well.

15. The method of claim 14, wherein the third ions are implanted at an implantation energy in a range of 100-250 KeV, and a dose in a range of 1E12-5E12 ions/cm$^2$.

16. The method of claim 10, wherein the high-voltage MOS transistor region contains a PMOS high-voltage transistor, and the third ions comprise impurity ions having a conductivity type identical to the second well, and the third ions are implanted at an implantation energy of 170 KeV at a dose of 2.5E12 ions/cm$^2$.

17. The method of claim 10, wherein the first and second gate electrodes are formed simultaneously.

18. The method of claim 17, wherein the first and second gate oxide layers are formed simultaneously.

19. The method of claim 10, wherein the first photoresist pattern blocks implantation of the second ions into the high-voltage MOS transistor region.

20. The method of claim 19, wherein the second photoresist pattern blocks implantation of the third and fourth ions into the low-voltage MOS transistor region.

* * * * *